United States Patent [19]

Gerrath et al.

[11] Patent Number: 4,805,465
[45] Date of Patent: Feb. 21, 1989

[54] ARRANGEMENT FOR THE PRODUCTION OF STRAIGHT-LINE SYMMETRICAL SIGNALS

[75] Inventors: Karl-Heinz Gerrath; Eberhard Strauss, both of Griesheim; Hans-Joachim Decker, Wiesbaden; Heinz Vinson, Langen, all of Fed. Rep. of Germany

[73] Assignee: Battelle-Institut e.V., Frankfurt am Main, Fed. Rep. of Germany

[21] Appl. No.: 59,220

[22] Filed: Jun. 8, 1987

[30] Foreign Application Priority Data

Jun. 9, 1986 [DE] Fed. Rep. of Germany ....... 3619408

[51] Int. Cl.[4] .......................... G01L 3/04; G01L 3/10; G01D 5/244
[52] U.S. Cl. ................................ 73/862.34; 73/866.1
[58] Field of Search ......................... 73/862.34, 866.1; 324/165, 166, 163; 356/375; 250/231 SE

[56] References Cited

U.S. PATENT DOCUMENTS

| 2,346,976 | 4/1944 | Langer et al. | 73/862.34 |
| 3,049,003 | 8/1962 | Felder | 73/862.34 |
| 3,505,865 | 4/1970 | Kihlberg et al. | 73/862.34 |
| 3,587,305 | 6/1971 | Parkinson et al. | 73/862.34 |
| 3,897,766 | 8/1975 | Pratt, Jr. et al. | 73/862.34 X |
| 4,262,251 | 4/1981 | Fujishiro et al. | 324/166 X |
| 4,683,746 | 8/1987 | Cullingford et al. | 73/862.34 X |

FOREIGN PATENT DOCUMENTS

| 1060609 | 7/1959 | Fed. Rep. of Germany . |
| 2231571 | 1/1974 | Fed. Rep. of Germany ... 73/862.34 |
| 3235122 | 4/1983 | Fed. Rep. of Germany . |
| 3007311 | 11/1985 | Fed. Rep. of Germany . |
| 3509763 | 5/1986 | Fed. Rep. of Germany . |
| 2238923 | 2/1975 | France | 73/862.34 |
| 699450 | 12/1979 | U.S.S.R. | 73/862.34 |
| 714182 | 2/1980 | U.S.S.R. | 73/862.34 |
| 920410 | 4/1982 | U.S.S.R. | 73/862.34 |
| 996876 | 2/1983 | U.S.S.R. | 73/862.34 |
| 2107880 | 5/1983 | United Kingdom . |

Primary Examiner—Tom Noland
Attorney, Agent, or Firm—Spencer & Frank

[57] ABSTRACT

An arrangement for the production of straight-line symmetrical signals from at least two signal generators, which have a periodic structure and which are movable relative to one another, by means of sensors that generate signals corresponding to the position of the signal generators, wherein at least two sensors are provided for at least one of the two signal generators with the output signals of the two sensors being combined in a subtraction or addition stage. The two sensors are positioned to be offset with respect to each other by one half period of the structure of signal generator or by an integer multiple of such period.

15 Claims, 4 Drawing Sheets

ARRANGEMENT FOR THE PRODUCTION OF STRAIGHT-LINE SYMMETRICAL SIGNALS

BACKGROUND OF THE INVENTION

The invention relates to an arrangement for the production of straight-line or even symmetrical signals from at least two signal generators, which have a periodic structure and which are movable with respect to each other, by means of sensors that generate signals corresponding to the position of the signal generators.

Straight-line symmetrical signals are needed, for example, to ascertain the torque and torsion in rotating shafts. Gear wheels, marked wheels, rings, etc. already installed, or specially provided for this purpose, are generally used as the signal generators. The generation of signals is effected, for example, by magnetic sensors, such as Hall-effect devices, field plate sensors or, preferably, differential arrangements in which the difference of the external magnetic resistance at the poles of the sensor determines the sensor signal. In this arrangement, any particular sensor can only be used for one particular signal generator geometry with one particular periodic structure. Any deviation in the periodic structure, for example, in the tooth pitch in the case of gear wheels, will result in odd or skew-symmetrical signals which falsify the measurement result.

Federal Republic of Germany DE-OS No. 32 35 122 discloses a torque measuring instrument in which shifts or displacements of the shaft are compensated by the fact that four sensors are mounted in a horizontal plane on opposite sides of the shaft which is marked with patterns. In this arrangement, however, simultaneous symmetrization of the signals is not possible.

SUMMARY OF THE INVENTION

The object of the present invention is to create an arrangement by means of which skew-symmetrical sensor signals can be eliminated. This arrangement is thus intended to make it possible to use any gears, wheels, disks, etc. present in a machine, for example, a gear box, as a generator without the need to provide a separate special sensor adapted to such a generator in order to obtain straight-line symmetrical signals.

The above object is achieved according to the present invention in that for at least one of the two signal generators, at least two sensors are provided whose output signals are combined in a subtraction or addition stage, and the two sensors are offset with respect to each other by at least one half period of the signal generator structure.

The two sensors for the single transmitter are preferably offset with respect to each other by one half period plus one or several complete periods of the signal generator structure. In a particularly preferred embodiment of the invention, the two sensors are positioned to be offset with respect to each other so that they are located in relation to the signal transmitter at two points as nearly opposite as possible.

The arrangement of the invention permits compensation for the shifts of the shaft with simultaneous symmetrization of the output signal. Since both sensors are assigned in each case to one generator, any spatial arrangement of the two sensors in relation to the sensors of the other generator is conceivable. If not required, compensation can be dispensed with for one generator, so that, in that event, only a total of three sensors is required. Furthermore, the arrangement requires only a low degree of electronic complexity.

The invention is explained in more detail by the description below and the drawings.

DETAILED DESCRIPTION OF THE PREFERRED EMBODIMENT

Figure 1:
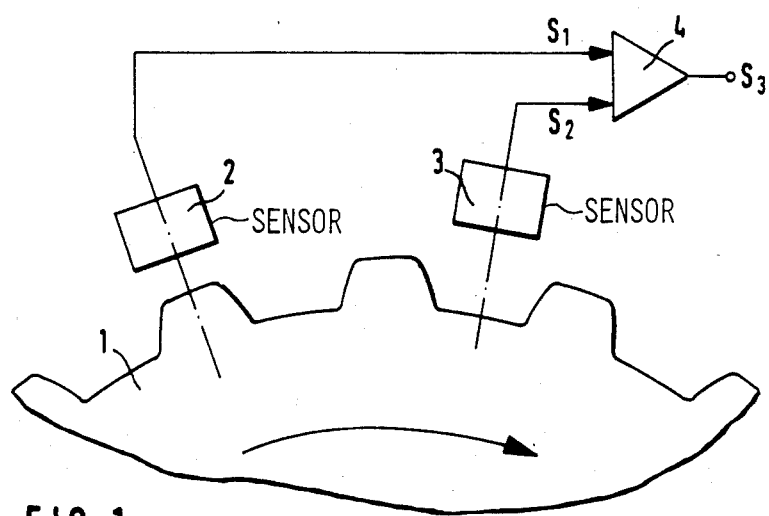
FIG. 1 shows one embodiment of the arrangement according to the invention when a gear wheel is used as the signal generator.

In the arrangement of FIG. 1, a straight-line symmetrical signal is obtained by combining two originally skewsymmetrical signals produced by means of two sensors 2 and 3 positioned adjacent a generator wheel 1 which, in the illustrated case, is a gear wheel. However, the generator wheel 1 may be any type of wheel with a periodic detectable structure on its peripheral surface, e.g., a wheel with periodic optical markings. The two sensors 2 and 3 are positioned to be offset with respect to each other by at least one half period of the tooth pitch of the generator wheel 1. In the case illustrated, the distance is one half pitch plus one complete pitch.

Figure 2:
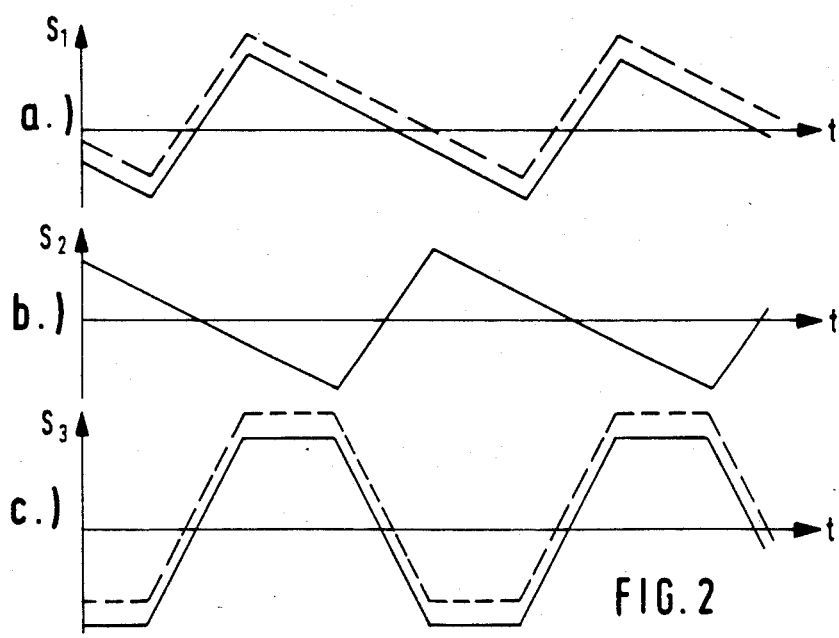
FIG. 2 shows sensor signals plotted against time for the arrangement of FIG. 1.

The arrangement shown in FIG. 1 yields the odd or skew-symmetrical sensor signals S1 and S2 plotted against time shown in FIGS. 2(a) and 2(b) at the outputs of the sensors 2 and 3, respectively. By subtracting one sensor signal from the other, for example, in a difference amplifier 4, one obtains the desired straight-line or even symmetrical total signal S3 shown in FIG. 2 c) at the output of the amplifier 4. It should be noted that as used herein, the term straight-line or even symmetrical signal means a signal wherein, with respect to a vertical axis of symmetry, $S(t)=S(-t)$ as shown for example in FIG. 2 c), whereas the term odd or skew-symmetrical signal means a signal wherein, with respect to a vertical axis of symmetry, $S(t)=-S(-t)$ as shown for example in FIGS. 2(a) and 2(b).

If, as compared to FIG. 2(a) and (b), the phase of one of the two sensor signals is shifted by one half period, then the two sensor signals must be added to one another to obtain the total straight-line symmetrical signal S3, i.e. the amplifier 4 must be a summing rather than a difference amplifier. As indicated by the dashed line curves in FIG. 2, a change in the direct current portion of the sensor signals does not change the profile of the straight-line symmetrical curve.

In principle, the arrangement according to the invention is suitable for all sensors that have an odd or skew-symmetrical output signal.

Figure 3:
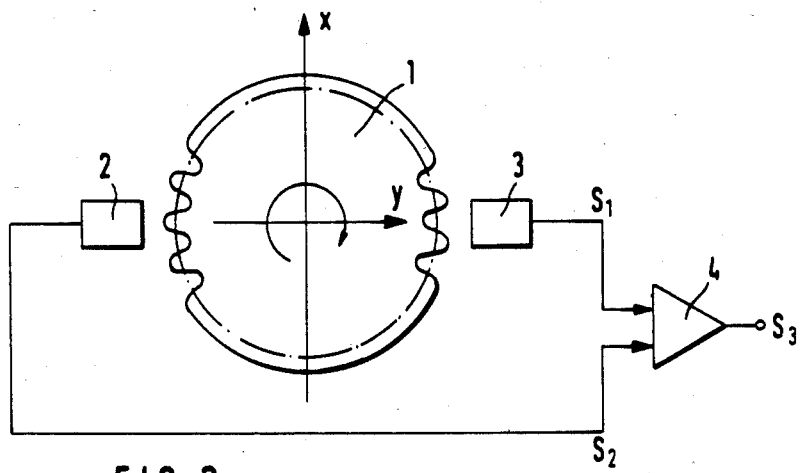
FIG. 3 shows a preferred embodiment of the arrangement according to the invention.
Figure 4:
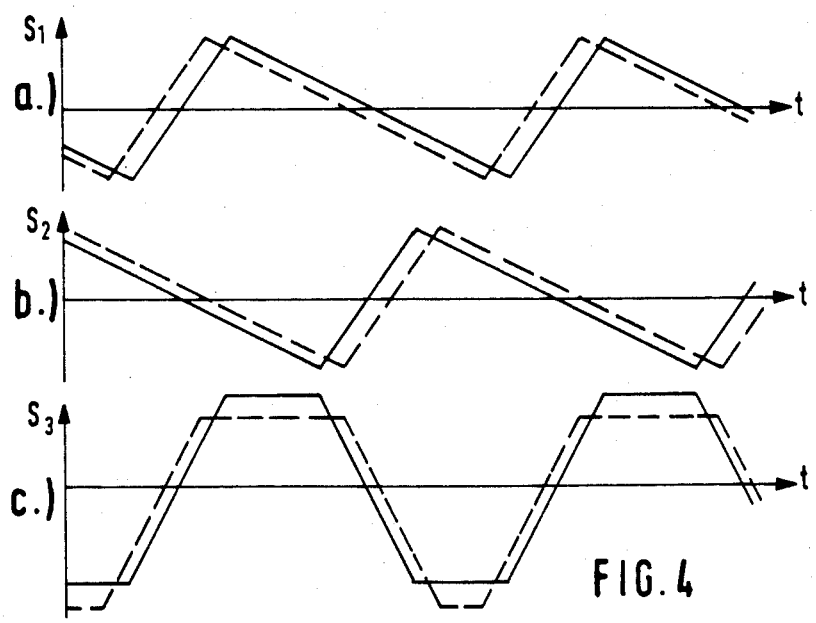
FIG. 4 shows sensor signals plotted against time for the arrangement of FIG. 3.

FIG. 3 shows an especially preferred embodiment of the invention. In this embodiment sensors 2 and 3 are offset by an odd-numbered multiple of the pitch so that they are exactly opposite each other on the generator wheel 1. In the ideal case, this is possible only if generator wheel 1 has an odd number of teeth, but in practice it also applies if a large even number of teeth are present. Shifts or movement of the shaft due to bearing play along the Y axis, as shown in FIG. 4, do not lead to a relative phase shift in the signals of sensors 2 and 3. The amplitudes are changed but the zero crossing is maintained for the total signal. A shift or movement along the X axis causes a certain negative phase shift in the case of sensor 2 and an equivalent positive phase shift in the case of sensor 3, as shown by the broken lines in FIG. 4. However, the mean position of the total signal S3 is not affected. If, contrary to the present invention, only one sensor 2, 3 were installed, this would generate a measurement error. Moreover, the use of two sensors according to the invention causes the influences on the measured value of an index or pitch error distributed sinusoidally over the circumference of generator wheel 1 and of odd multiples of the period to be similiarly eliminated. FIG. 3 also shows that the outputs of sensors 2 and 3 are transmitted to a difference amplifier or a summation amplifier 4 from whose output the total signal S3 is obtained.

Figure 5:
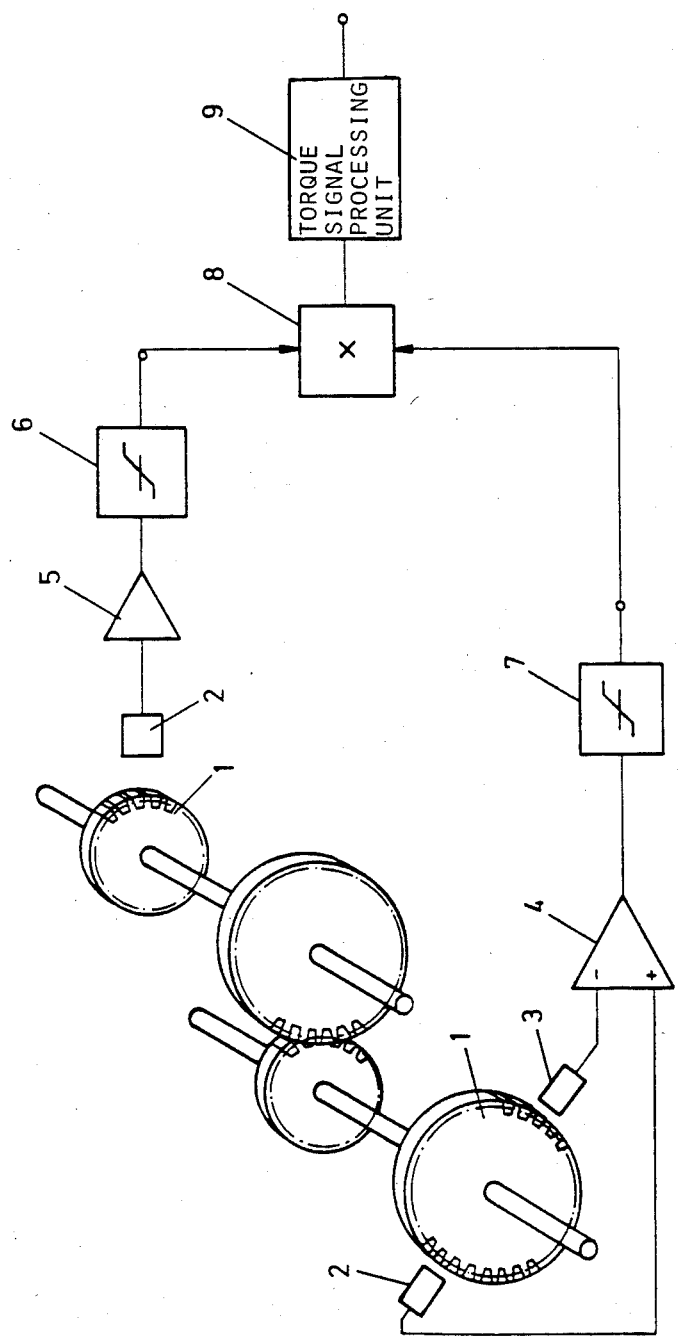
FIG. 5 shows an embodiment of the configuration according to the invention for torque measurement.

FIG. 5 shows an embodiment for torque measurement via a gear stage. One of the Generator Wheels 1, which are used as signal generators, is provided with two Sensors 2 and 3, while the other Signal Generator 1 is provided only with one Sensor 2. The output signals of the Sensors 2 and 3, which are assigned to a signal generator, are supplied to the Differential Amplifier 4. The output signal of the single Sensor 2 is supplied to an Amplifier 5. The output signals of the Amplifiers 4 and 5 are supplied to Limiters 6 and 7, respectively, and converted into pulse-shaped signals. The output signals of Limiters 6 and 7 are fed into a Multiplier 8, at the output of which signal integration or signal evaluation is effected by torque measurement signal generating unit 9 by well known means such as described in Federal Republic of Germany Offenlegungsschrift No.; DE-35 09 763, published May 22, 1986. At the output of unit 9 a signal is available which is proportional to the torque transmitted via the illustrated shaft arrangement between the Signal Generator Wheels 1.

Figure 6:
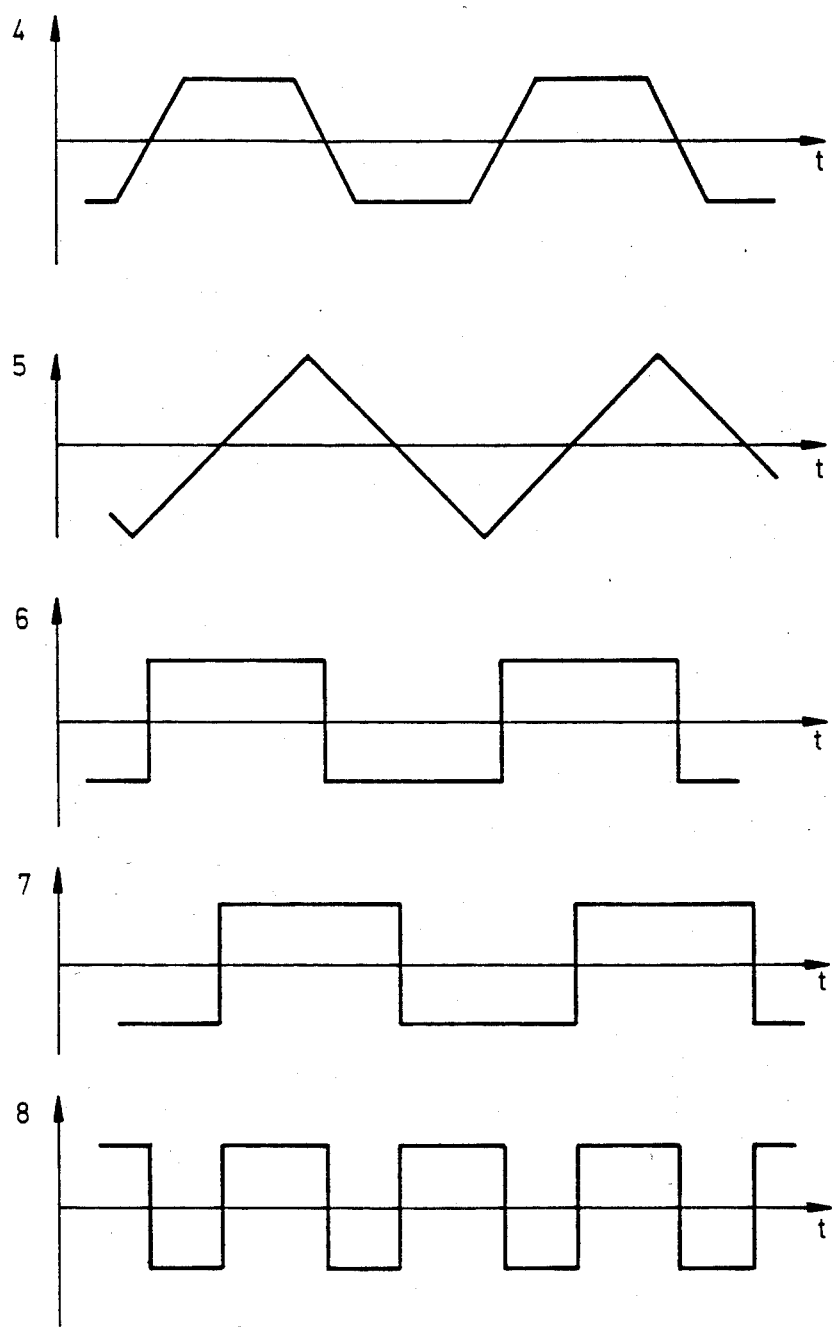
FIG. 6 shows output signals of the amplifiers, the limiters and the multiplier plotted versus time for the configuration shown in FIG. 5.

FIG. 6 shows the signal transmission path in the configuration according to FIG. 5. It depicts the signals at the outputs of the Amplifiers 4 and 5, at the outputs of the Limiters 6 and 7, and at the output of Multiplier 8.

It will be understood that the above description of the present invention is susceptible to various modifications, changes and adaptations, and the same are intended to be comprehended within the meaning and range of equivalents of the appended claims.

What is claimed is:

1. In an arrangement for the production of straight-line symmetrical signals from at least two signal generators, which each have a periodic structure and which are movable relative to one another, using respective sensors that generate signals corresponding to the respective positions of said signal generators; the improvement wherein: at least two of said sensors are provided for at least one of said signal generators; the output signals of said at least two of said sensors are combined in a subtraction or addition stage; and said at least two of said sensors are positioned to be offset with respect to each other by at least one half period of said periodic structure of said at least one of said signal generators.

2. The arrangement according to claim 1 wherein said at least two of said sensors are positioned to be offset with respect to one another by one half period plus one or more complete periods of said periodic structure of said one of said signal generators.

3. The arrangement according to claim 2 wherein said signal generators are wheels each having said periodic structure on its periphery.

4. The arrangement according to claim 3 wherein said at least two sensors are offset with respect to one another so that they are located at two points which, with regard to said one of said signal generator, are as nearly opposite as possible.

5. The arrangement according to claim 3 wherein said wheels are gear wheels.

6. The arrangement according to claim 2 wherein said at least two sensors are offset with respect to one another so that they are located at two points which, with regard to said one of said signal generator, are as nearly opposite as possible.

7. The arrangement according to claim 1 wherein said at least two sensors are offset with respect to one another so that they are located at two points which, with regard to said one of said signal generator, are as nearly opposite as possible.

8. The arrangement according to claim 1 wherein said signal generators are wheels each having said periodic structure on its periphery.

9. The arrangement according to claim 8 wherein said wheels are gear wheels.

10. The arrangement according to claim 1 wherein said sensors produce skew-symmetrical signals.

11. The arrangement according to claim 1 wherein: said arrangement is used to measure the torque between the input and output of a shaft arrangement; said two signal generators are mounted on the input and output, respectively of said shaft arrangement for rotation therewith; and means are provided for combining the output signal from said stage and the output signal from the sensor for the other of said generators to provide a measure of the torque.

12. In an apparatus for measuring the torque between first and second positions on a rotating shaft arrangement including first and second signal generator wheels, each having a periodic structure on its periphery, disposed at said first and second positions respectively for rotation with said shaft arrangement, first and second sensor means, disposed adjacent said first and second generator wheels respectively and responsive to the respective periodic structures, for providing respective first and second output signals corresponding to the respective positions of said generator wheels, and means for combining said first and second output signals to provide a measure of the torque between said first and second positions; the improvement wherein at least one of said first and second sensor means includes two sensors positioned to be offset with respect to each other by at least one half period of the periodic structure of the respectively associated said generator wheel, and with each of said two sensors being responsive to the periodic structure to produce a respective output signal, and a subtraction or addition stage to which said output signals from said two sensors are fed and which provides an output signal corresponding to one of said first and second output signals.

13. Apparatus according to claim 12 wherein said two sensors are positioned to be offset with respect to one another by one half period plus at least one complete period of said periodic structure of said respectively associated said generator wheel.

14. The apparatus according to claim 13 wherein said signal generator wheels are gear wheels.

15. The apparatus according to claim 13 wherein said two sensors are offset with respect to one another so that they are located at two points which, with regard to said respectively associated said signal generator wheel, are as nearly opposite as possible.

* * * * *